United States Patent
Colin et al.

(10) Patent No.: US 6,904,067 B2
(45) Date of Patent: Jun. 7, 2005

(54) BACK FACET WAVELENGTH LOCKER TUNING AND ASSEMBLY METHOD

(75) Inventors: Sylvain M. Colin, Milpitas, CA (US); Raghuram Narayan, Fremont, CA (US); Owen B. Pine, Fremont, CA (US)

(73) Assignee: Intel Corporation, Santa Clara, CA (US)

( * ) Notice: Subject to any disclaimer, the term of this patent is extended or adjusted under 35 U.S.C. 154(b) by 191 days.

(21) Appl. No.: 10/264,464

(22) Filed: Oct. 3, 2002

(65) Prior Publication Data

US 2004/0070840 A1 Apr. 15, 2004

(51) Int. Cl.$^7$ ............... H01S 3/10; H01S 3/13
(52) U.S. Cl. ............ 372/29.02; 372/9; 372/32; 372/20; 372/23
(58) Field of Search .............. 372/9, 29.02, 32, 372/20, 23

(56) References Cited

U.S. PATENT DOCUMENTS 6,207,950 B1 * 3/2001 Verdiell ................ 250/239
6,227,724 B1   5/2001 Verdiell
6,400,739 B1   6/2002 Auracher

FOREIGN PATENT DOCUMENTS

EP      1 158 630 A1     11/2001
EP     001158630 A1  *  11/2001

* cited by examiner

Primary Examiner—Minsun Oh Harvey
Assistant Examiner—Armando Rodriguez
(74) Attorney, Agent, or Firm—Kevin A. Reif

(57) ABSTRACT

Wavelength lockers, which monitor the wavelength drift of a laser's beam due to aging, are tunable to adjust for manufacturing misalignments between its various optical components. Tuning is accomplished by adjusting the position of a collimating lens using a flexure. Adjusting the lens position changes the angle of incidence of a monitored beam relative to a fixed filter and detector and avoids the challenging manufacturing task of rotating the filter and detector to achieve the same result.

18 Claims, 5 Drawing Sheets

BACK FACET WAVELENGTH LOCKER TUNING AND ASSEMBLY METHOD

FIELD OF THE INVENTION

Embodiments of the present invention are directed to wavelength lockers and, more particularly, to arrangements and methods for tuning wavelength lockers.

BACKGROUND INFORMATION

Wavelength division multiplexing (WDM) is a technique used to transmit multiple channels of data simultaneously over the same optic fiber. At a transmitter end, different data channels are modulated using light having different wavelengths or, colors if you will, for each channel. The fiber can simultaneously carry multiple channels in this manner. At a receiving end, these multiplex channels are easily separated prior to demodulation using appropriate wavelength filtering techniques.

The need to transmit greater amounts of data over a fiber has led to so-called Dense Wavelength Division Multiplexing (DWDM). DWDM involves packing additional channels into a given bandwidth space. The resultant narrower spacing between adjacent channels in DWDM systems demands precision wavelength accuracy from the transmitting laser diodes.

Unfortunately, as laser diodes age, they are known to exhibit a wavelength drift of up to 0.15 nm from their set frequency over about a fifteen year period. In a DWDM system this wavelength drift is unacceptable as a given channel may drift and interfere with adjacent channels causing cross talk. Thus, most laser transmitters use what is commonly referred to in the art as a wavelength locker to measure drift frequency vs. set frequency. This information can be fed back to a controller such that, various parameters, such as temperature or drive current, of the laser diode can be adjusted to compensate for the effects of aging and keep the diode laser operating at its set frequency. Most laser transmitters with an integrated wavelength locker use either an etalon or thin film filter to measure the laser wavelength variation. In order to work accurately, it is important that the locker be tuned by precision alignment with the collimated beam being monitored. A typical wavelength locker requires a placement accuracy of the etalon and collimated beam within better than +/- 0.5 degree.

BRIEF DESCRIPTION OF THE DRAWINGS

The following is a brief description of the drawings, wherein like numerals indicate like elements throughout.

DETAILED DESCRIPTION

Figure 1:
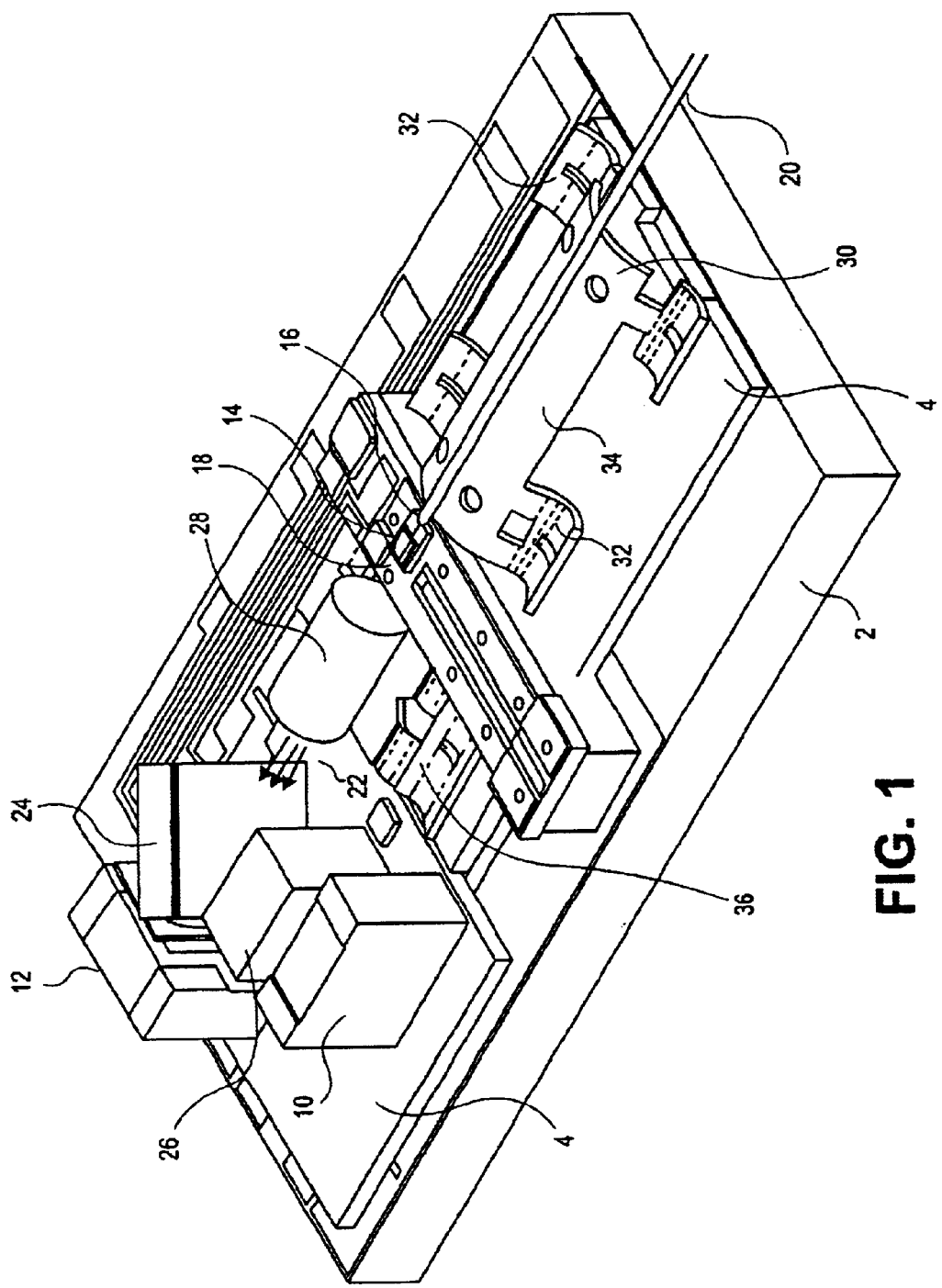
FIG. 1 is a plan view of a wavelength locker according to one embodiment of the invention.

Referring now to the drawings and, more particularly to FIG. 1, one embodiment of the present invention shows a wavelength locker package having a quasi-planar substrate 2 having a positioning floor 4. First and second detectors, 10 and 12, respectively, are attached to the floor 4. A laser 14, produces a laser beam centered about a set frequency or wavelength. The laser 14 emits a light beam from both a front facet 16 and a back facet 18. The actual modulated light carrying the data channel emerges from the front facet 16, which is coupled to an optical fiber 20. The beam 22 that emerges from the back facet 18 and is used for monitoring purposes. A lens 28, such as a graded index (GRIN) lens, is used to collimate the beam 22.

These components require precise alignment and present many challenges during manufacture when actually attaching the various devices to the positioning floor 4. In high performance opto-electronic packages, such as these, critical optical elements require more precise placement than can be obtained with the combination of floor height control and two-dimensional pick and place.

Thus as shown, the fiber 20 is mounted using a miniature flexure 30 which allows for a small amount of vertical adjustment. In one embodiment, the flexure 30 is made of thin spring steel that has been etched or stamped, then bent in a press. The flexure 30 may comprise of two or more legs 32 which rest on the substrate surface or positioning floor 4. In one embodiment, the legs are joined by a bridge 34 that supports or clamps the fiber 20. When the bridge 34 is translated in the y direction, opposite legs 32 give elastically in opposite x directions.

The flexure 30 may be designed so that in its natural or non-flexed state, the optical axis of the optical component attached to the bridge rests slightly above the optical plane of the package. Final adjustment of the height is obtained by applying pressure to the flexure 30, thereby lowering the bridge 34 height. Dragging the flexure 30 in the plane parallel to the plane of the substrate may be used to correct the lateral position. When adequate alignment is reached, the legs 32 are permanently attached to the floor 4 or substrate 2. The attachment may be by, for example, laser welding, soldering, or adhesive bonding.

In another refinement of the flexure design, the flexure 30 has more than two legs. The first pair of legs is attached to the frame after coarse optical alignment. The flexure is then finely realigned, using the residual flexibility left after the two first legs are attached. When the optimum position is reached, the remaining legs are attached. Various flexure designs are described in U.S. Pat. Nos. 6,207,950 and 6,227,724.

Still referring to FIG. 1, in operation a collimated beam 22 emerges from lens 28 and thereafter encounters a splitter 24 that splits the beam 22 into two additional beams. The first beam is shown reflected at an angle normal to the original beam 22. This reflected beam passes through an etalon (filter) 26 and then falls on the first detector 10. The second beam passes straight through the splitter 24 and falls upon the second detector 12.

The portion of the beam that traverses the etalon 26 is a function of both the beam's power and the wavelength of the beam. The portion of the beam that passes directly from the splitter 24 to the second detector 12 is a function of the beam's power. Thus, by subtracting these two components the wavelength of the beam currently being output can be determined and compared to the set frequency to determine any drift of the laser's output.

Figure 2:
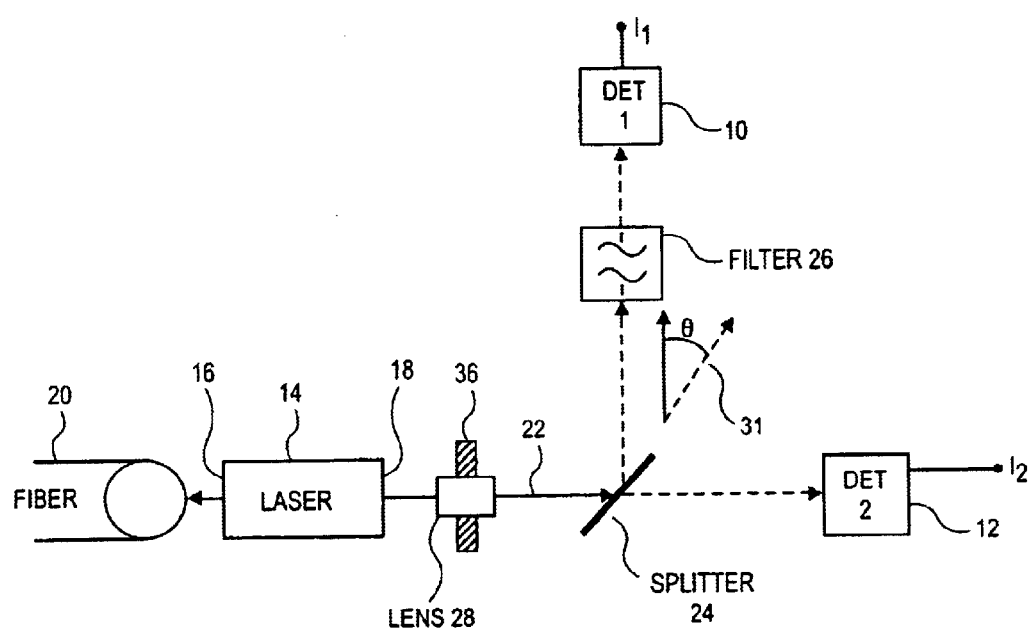
FIG. 2 is a block diagram showing a simplified view of the wavelength locker of FIG. 1.

FIG. 2 shows a simplified block diagram of the wavelength locker according to one embodiment of the invention. As will be appreciated by those skilled in the art, this type of wavelength locker is very sensitive to alignment with the collimated beam 22 and raises many packaging concerns. The response of an etalon 26 verses the beam angle of incidence on etalon is:

$$v = \frac{v_0}{\cos\left(\frac{\theta}{n}\right)}$$

Where:

v peak transmission frequency shift;

$v_0$ is the peak frequency at normal incidence;

θ is the angle of incidence in air; and n the index of refraction of the etalon (e.g., for fused silica, n=1.44 around 1550 nm).

As shown in FIG. 2, when the angle θ is zero degrees as shown, $v=v_0$, since the cosine divisor of the above equation is 1 when θ is zero. As shown by dotted line 31, any deviation from a zero degree angle of incidence and the response of the etalon will be skewed and the output waveform shifted out of phase.

Figure 3:
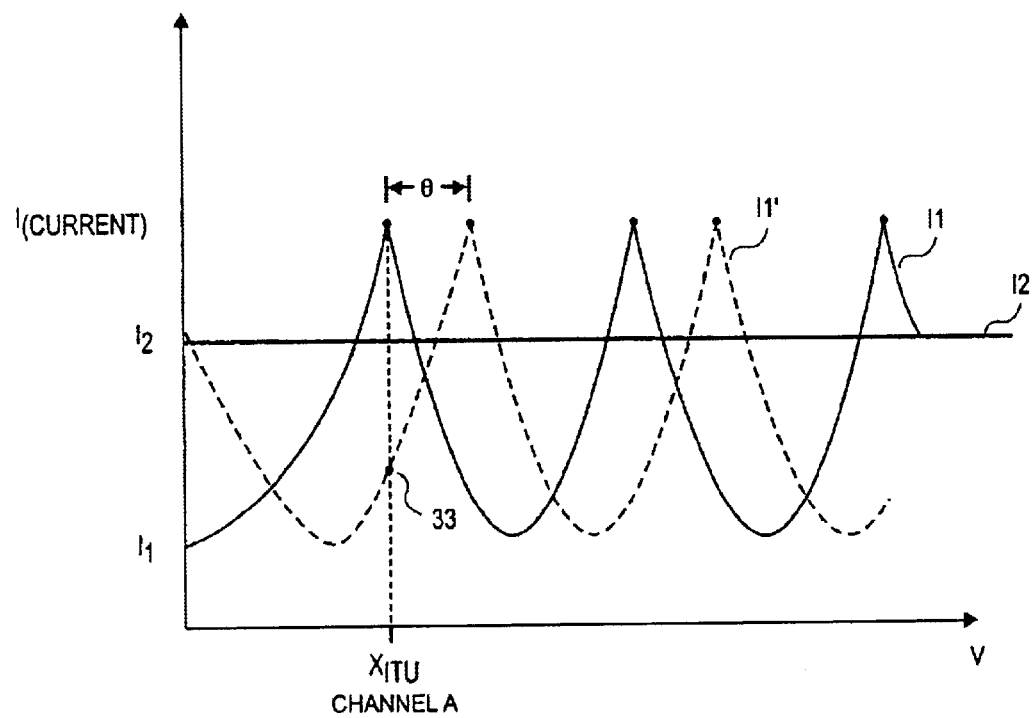
FIG. 3 is a graph plotting output current from the wavelength locker detectors against frequency.

Referring to FIG. 3, there is shown a graph plotting current, I1 and I2, output from the detectors, 10 and 12, respectively, against the frequency (i.e., 1/wavelength) of the laser beam. As illustrated, the output from detector 10 (I1) comprises a frequency component and a power component. The output from detector 12 (I2) comprises the laser's output beam power component and is therefore illustrated as a horizontal line. The output I1 from detector 10 comprises both a power component and a wavelength component and is therefore illustrated as a waveform shifted in the positive direction along the y axis.

In operation, the wavelength locker monitors changes in wavelength or frequency. However, as illustrated in FIG. 3, this is sometimes difficult when monitored channel falls on either a peak or a trough of the frequency waveform. Thus, for example when monitoring ITU (International Telecommunication Union) channel A, if the angle of incidence θ is at a point where the output waveform I1 is at a peak, it is difficult to monitor since the slope dI/dv=0. Hence, to more accurately monitor the frequency, tuning the angle of incidence θ is desirable to change the phase of the waveform from I1 to I1'. This allows the wavelength locker to monitor a more suitable portion of the waveform 33 where small changes in dI/dv can be more readily detected and providing a more accurate reading.

Figure 4:
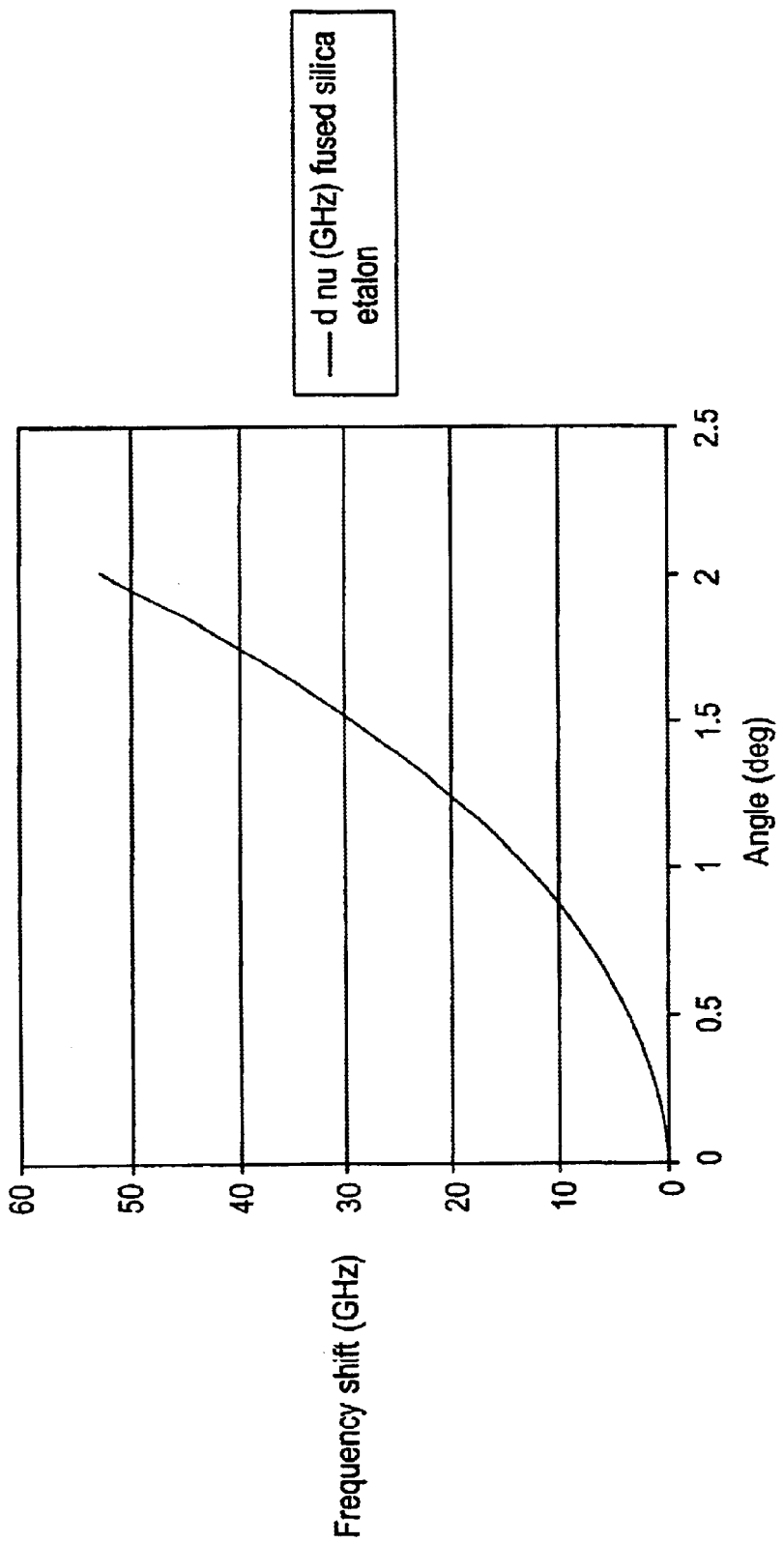
FIG. 4 is a graph showing peak transmission frequency verses beam angle of incidence on the etalon.

However, as illustrated in FIG. 4, only a very small change in the angle of incidence is warranted. FIG. 4 shows a graph plotting frequency shift against the beam angle of incidence. When the angle of incidence θ is 0 degrees, the frequency shift is 0. As is further illustrated in this example, the measured wavelength currently being output by the laser 14 is very sensitive to the angle of incident. As shown, a shift in the angle of incident of less that 1 degree results in a 10 GHz measured frequency shift. This skew is exponential in nature as a rotation of the etalon 26 and detector 10 to the collimated beam of as little as 2 degrees causes a measured frequency shift of greater than 50 GHz. As those skilled in the art will appreciate, in order to shift the waveform I1 to I1' as shown in FIG. 3, only slight changes in the angle of incidence is need.

One way of changing the angle of incidence θ is by controlling the rotation of the etalon 26 and first detector 10 relative to the beam. That is, when mounting these items during the manufacturing process, care must be taken to ensure that they are positioned so that the angle is precisely rotated to the desired angle from zero (i.e., so that the portion of the beam reflected from the splitter 24' is slightly rotated from the normal to the etalon 26 and detector 10). However, in practice this is sometimes difficult to achieve and some fine tuning of the wavelength locker components may be necessary after the various components are fixed in place relative to the substrate.

According to one embodiment of the invention, it has been discovered that rather than rotating the detector 10 and etalon 26, fine tuning of the wavelength locker can be achieved simply by adjusting the position of the flexure 36, and thus the position of the lens 28 (i.e., in the x and/or y-directions). That is, translating the lens 28 up and down and side to side relative to the substrate 2 has the same effect as rotating the detector 10 and etalon 26 relative to the beam reflected from the splitter 24 and thus changes the angle of incidence. However, unlike rotating the detector and etalon which would require additional machining components, fine tuning of the angle of incidence can be achieved by using the machines already developed for flexure coupling.

Referring again to any of FIG. 1, 4, or 5, in one embodiment of the present invention, a lens mount 36 is used that allows the lens to be easily adjusted in the x or y-directions. In one embodiment, the lens mount comprises a flexure 36. Just as the first flexure 30 used to mount the fiber 20, a lens flexure 36 is used to mount the lens 28 relative to the substrate 2.

Figure 5:
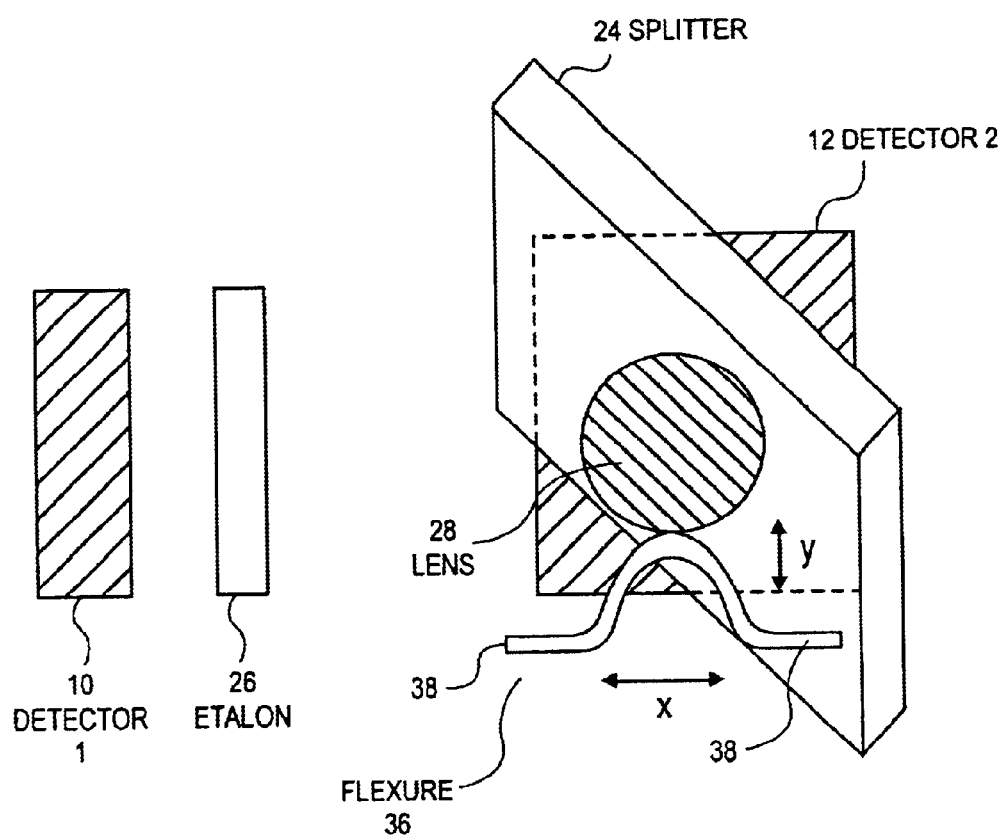
FIG. 5 is a block diagram showing a flexure used to adjust the height of a collimating lens.

FIG. 5 shows a front view looking into the lens 28. As above, the lens flexure 36 may be designed so that in its natural or non-flexed state, the optical axis of the lens 28 mounted thereto rests slightly above the optical plane of the package. Final adjustment of the height is obtained by applying pressure to the flexure 36, therefore lowering the lens 28 height. Lateral positioning of the lens 28 is achieved by translating the legs 38 of the flexure in the x-directions When adequate alignment is reached, the legs 38 are permanently attached to the floor or substrate 2 (not shown in FIG. 5). In this case, alignment is reached when the angle of incidence, θ, between the beam reflected from the splitter 24 and the etalon 26 and detector 10 is shifted to a desired position as illustrated in FIG. 3. The attachment may be by, for example, laser welding, soldering, adhesive bonding or any other suitable method.

Embodiments of the present invention are specifically illustrated and/or described herein. However, it will be appreciated that modifications and variations of the present invention are covered by the above teachings and within the purview of the appended claims without departing from the spirit and intended scope of the invention.

What is claimed is:

1. A wavelength locker, comprising:

a first detector to detect a monitored beam;

a second detector to detect the monitored beam offset from said first detector;

a lens; and a lens mount to translate said lens in at least one of x and y-directions relative to an optical axis of the monitored beam to change an angle of incidence between the monitored beam and said first detector, wherein said lens mount is a flexure.

2. The wavelength locker as recited in claim 1 wherein said flexure comprises at least one pair of legs connected by a bridge.

3. The wavelength locker as recited in claim 2 wherein said legs are elastic.

4. The optical device as recited in claim 1 further comprising:
a splitter to split a collimated beam from said lens into a first beam and a second beam;
a filter to filter said first beam;
said first detector to receive said filtered first beam; and
said second detector to receive said second beam, wherein said angle of incidence between said first beam and said filter and said first detector is a function of a position of said lens in at least one of x and y-directions.

5. A wavelength locker device, comprising:
a lens to collimate a beam;
a splitter to split the collimated beam into a first beam and a second beam;
a filter to filter said first beam;
a first detector to receive said filtered first beam;
a second detector to receive said second beam; and
an adjustable lens mount to adjust a position of said lens to change an angle of incidence between said first beam and said first detector, wherein said adjustable lens mount comprises a flexure.

6. The wavelength locker as recited in claim 5 wherein said flexure comprises at least a pair of legs connected by a bridge.

7. The wavelength locker as recited in claim 6 wherein said legs are elastic.

8. The wavelength locker as recited in claim 7 wherein fixing said legs in the x-direction fixes said lens in the y-direction.

9. A method for tuning an optical device, comprising:
collimating a beam with a lens;
placing the lens on a flexure;
splitting the collimated beam into a first beam and a second beam;
filtering said first beam;
receiving said filtered first beam with a first detector;
receiving said second beam with a second detector,
adjusting at least one of a vertical and horizontal position of said lens to change the angle of incidence between the first beam and the first detector.

10. The method for tuning an optical device as recited in claim 9 further comprising locking said flexure in place when a desired angle of incidence is obtained.

11. The method for tuning an optical device as recited in claim 10 wherein said locking comprises one of welding, soldering, and adhesive bonding said flexure in place.

12. A wavelength locker comprising:
a first detector fixed to a surface aligned with a first axis;
a splitter to split a beam between said first axis and a substantially perpendicular axis;
a filter in line with a second detector fixed to said surface aligned substantially with said perpendicular axis;
a lens adjustable along said first axis to adjust an angle of incidence between the beam and said filter and said second detector; and
a flexure to mount said lens to said surface, said flexure movable in x and y directions relative to said surface.

13. The wavelength locker as recited in claim 12 wherein said flexure is locked in place when a desired angle of incidence is obtained.

14. The wavelength locker as recited in claim 13 wherein said flexure is locked in place by one of a weld, solder, and adhesive.

15. A wavelength locker, comprising:
a first detector positioned to receive a first portion of a monitored beam;
a second detector positioned to receive a second portion of the monitored beam;
a lens; and
a lens mount to translate said lens in at least one of x and y-directions to change an angle of incidence between the first portion of the monitored beam and said first detector, wherein said lens mount is a flexure.

16. The wavelength locker as recited in claim 15 wherein said flexure comprises at least one pair of legs connected by a bridge.

17. The wavelength locker as recited in claim 16 wherein said legs are elastic.

18. The optical device as recited in claim 15 further comprising:
a splitter positioned to split the monitored beam from said lens into the first portion of the monitored beam and the second portion of the monitored beam; and
a filter to filter the first portion of the monitored beam.

* * * * *